United States Patent
Lee et al.

(10) Patent No.: US 10,873,048 B2
(45) Date of Patent: Dec. 22, 2020

(54) QUANTUM-DOT LIGHT EMITTING DIODE, METHOD OF FABRICATING THE QUANTUM-DOT LIGHT EMITTING DIODE AND QUANTUM-DOT LIGHT EMITTING DISPLAY DEVICE

(71) Applicant: LG Display Co., Ltd., Seoul (KR)

(72) Inventors: Tae-Yang Lee, Paju-si (KR); Jong-Kwan Bin, Paju-si (KR); Kyung-Kook Jang, Paju-si (KR); Seul-Gi Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/599,879

(22) Filed: Oct. 11, 2019

(65) Prior Publication Data
US 2020/0119297 A1   Apr. 16, 2020

(30) Foreign Application Priority Data
Oct. 12, 2018   (KR) .......................... 10-2018-0121838

(51) Int. Cl.
*H01L 51/50* (2006.01)

(52) U.S. Cl.
CPC ........ *H01L 51/502* (2013.01); *H01L 51/5056* (2013.01); *H01L 51/5092* (2013.01)

(58) Field of Classification Search
CPC H01L 51/502; H01L 51/5056; H01L 51/5092
See application file for complete search history.

(56) References Cited

U.S. PATENT DOCUMENTS

| 10,371,969 B2 * | 8/2019 | Jang ...................... H01L 27/283 |
| 2012/0175593 A1 * | 7/2012 | Murayama ............ H01L 51/426 |
| | | 257/13 |
| 2012/0248410 A1 * | 10/2012 | Murayama .............. G06F 16/22 |
| | | 257/13 |
| 2013/0069036 A1 * | 3/2013 | Miyata ................. C09K 11/025 |
| | | 257/13 |
| 2014/0027713 A1 | 1/2014 | Cox et al. |
| 2016/0225947 A1 * | 8/2016 | Murayama ............ H01L 51/502 |

(Continued)

FOREIGN PATENT DOCUMENTS

| JP | 2009087782 A | 4/2009 |
| JP | 2010114079 A | 5/2010 |

OTHER PUBLICATIONS

Japanese Office Action dated Nov. 4, 2020 issued in corresponding Patent Application No. 2019-187431 w/English Translation (6 pages).

*Primary Examiner* — Nicholas J Tobergte
(74) *Attorney, Agent, or Firm* — Polsinelli PC (57) ABSTRACT

A quantum-dot (QD) light emitting diode and a quantum-dot light emitting display device are disclosed. The QD light emitting diode includes first and second electrodes facing each other; a QD emitting material layer between the first and second electrodes and including a QD; a first charge auxiliary layer between the first electrode and the QD emitting material layer; and a second charge auxiliary layer between the QD emitting material layer and the second electrode, wherein the QD includes a core, a shell surrounding the core and a ligand contacting a portion of the shell, and wherein the first charge auxiliary layer contacts the ligand, and the second charge auxiliary layer contacts the shell.

21 Claims, 6 Drawing Sheets

(56) References Cited

U.S. PATENT DOCUMENTS

2019/0288229 A1* 9/2019 Kim .................... H01L 51/5012
2019/0326533 A1* 10/2019 Kim ..................... C09K 11/883
2019/0367805 A1* 12/2019 Kim ...................... H01L 51/005

* cited by examiner

QUANTUM-DOT LIGHT EMITTING DIODE, METHOD OF FABRICATING THE QUANTUM-DOT LIGHT EMITTING DIODE AND QUANTUM-DOT LIGHT EMITTING DISPLAY DEVICE

CROSS REFERENCE TO RELATED APPLICATION

This application claims priority to and the benefit of Republic of Korea Patent Application No. 10-2018-0121838 filed on Oct. 12, 2018, which is hereby incorporated by reference in its entirety.

BACKGROUND

Field of the Disclosure

The present disclosure relates to a quantum-dot (QD) light emitting diode, and more particularly, to a QD light emitting diode and a QD light emitting display device having improved charge balance and a method of fabricating the QD light emitting diode.

Description of the Background

Recently, as society has entered in earnest upon an information age, a field of display devices that represent all sorts of electrical signals as visual images has been developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum-dots (QD) to display devices has been researched or studied. In the QD, an electron in unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

The QD light emitting diode using the QD includes an anode, a cathode facing the anode and a QD emitting layer. The QD emitting layer is disposed between the anode and the cathode and includes the QD. When the hole and the electron are respectively injected from the anode and the cathode into the QD emitting layer, the light is emitted from the QD emitting layer.

However, a charge balance in the QD light emitting diode is degraded such that the emitting efficiency of the QD light emitting diode is decreased. For example, since the hole injection rate may be slower than the electron injection rate, the charge balance in the QD emitting layer may be degraded.

SUMMARY

Accordingly, the present disclosure is directed to a QD light emitting diode, a QD light emitting display device and a method of fabricating the QD light emitting diode that substantially obviate one or more of the problems due to limitations and disadvantages of the related art, and have other advantages.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a QD light emitting diode includes first and second electrodes facing each other; a QD emitting material layer between the first and second electrodes and including a QD; a first charge auxiliary layer between the first electrode and the QD emitting material layer; and a second charge auxiliary layer between the QD emitting material layer and the second electrode, wherein the QD includes a core, a shell surrounding the core and a ligand at a portion of a surface of the shell, and wherein the first charge auxiliary layer contacts the ligand, and the second charge auxiliary layer contacts the shell.

In another aspect, a method of fabricating a quantum-dot (QD) light emitting diode includes steps of: forming a first or second electrode; forming a light emitting layer on the first or second electrode corresponding to a center of the first or second electrode; and forming a second or first electrode facing the first or second electrode on the light emitting layer, wherein the step of forming the light emitting layer includes steps of: forming a hole auxiliary layer corresponding to the center of the first electrode or forming an electron auxiliary layer corresponding to the center of the second electrode; coating a QD solution and drying it to form a layer having a plurality of pristine QDs on the hole auxiliary layer or electron auxiliary layer, each pristine QD including a core, a shell surrounding the core and a ligand formed on an entire surface of the shell; removing the ligand at a first side the shell so as to form a QD light emitting material layer (EML); and forming an electron or hole auxiliary layer on the QD EML, wherein one of the electron auxiliary layer and the hole auxiliary layer contacts the shell, and the other of the electron auxiliary layer and the hole auxiliary layer contacts the ligand at a second side of the shell.

In another aspect, a QD light emitting display device includes a substrate; a QD light emitting diode disposed over the substrate, the QD light emitting diode comprising: first and second electrodes facing each other; a QD emitting material layer between the first and second electrodes and including a QD; a first charge auxiliary layer between the first electrode and the QD emitting material layer; and a second charge auxiliary layer between the QD emitting material layer and the second electrode; and a thin film transistor between the substrate and the QD light emitting diode and connected to the QD light emitting diode, wherein the QD includes a core, a shell surrounding the core and a ligand at a portion of a surface of the shell, and wherein a distance between the shell and the first charge auxiliary layer is greater than a distance between the shell and the second charge auxiliary layer.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings.

Figure 1:
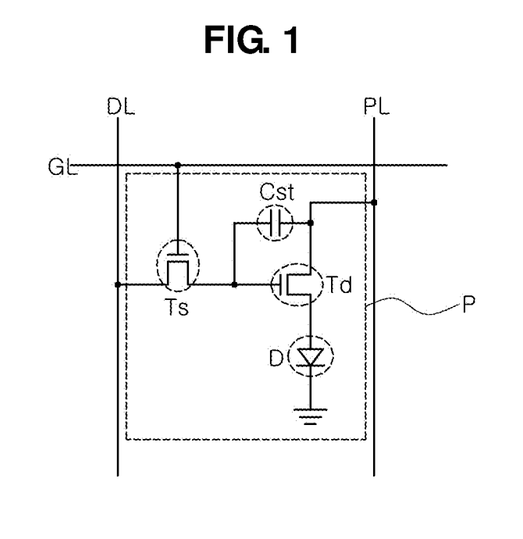
FIG. 1 is a schematic circuit diagram of a QD light emitting display device according to the present disclosure.

FIG. 1 is a schematic circuit diagram of a QD light emitting display device according to the present disclosure.

As shown in FIG. 1, in a QD light emitting display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and a QD light emitting diode D are formed.

The switching TFT Ts is connected to the gate line GL and the data line DL, and the driving TFT Td and the storage capacitor Cst are connected to the switching TFT Ts and the power line PL. The QD light emitting diode D is connected to the driving TFT Td.

In the QD display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the QD light emitting diode D from the power line PL through the driving TFT Td. As a result, the QD light emitting diode D emits light. The storage capacitor Cst serves to maintain the voltage of the gate electrode of the driving TFT Td for one frame. Accordingly, the electroluminescent display device displays images.

Figure 2:
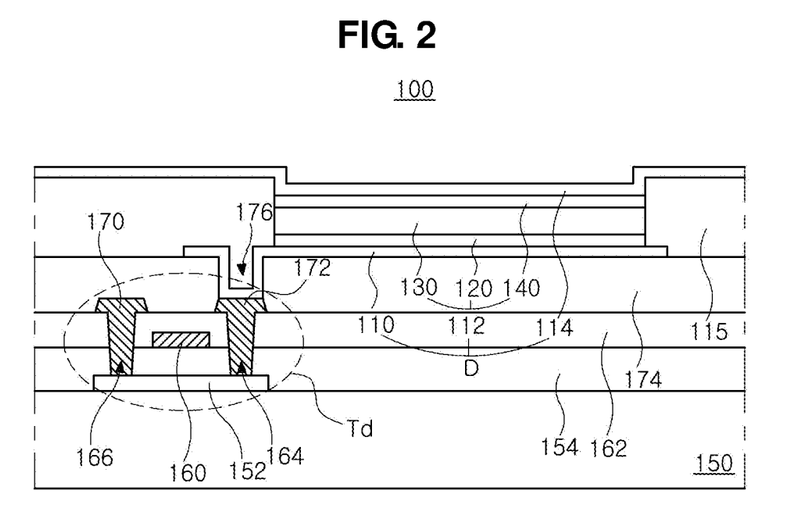
FIG. 2 is a schematic cross-sectional view of a QD light emitting display device of the present disclosure.

FIG. 2 is a schematic cross-sectional view of a QD light emitting display device of the present disclosure.

As shown in FIG. 2, the QD light emitting display device 100 includes a substrate 150, the TFT Td on the substrate 150 and the QD light emitting diode D over the substrate 150 and connected to the TFT Td.

The substrate 150 may be a glass substrate or a flexible substrate of polyimide. The substrate 150 may have a flexible property.

Although not shown, a buffer layer of an inorganic material, e.g., silicon oxide or silicon nitride may be formed on the substrate 150.

The TFT Td is connected to the switching TFT Ts (of FIG. 1) and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or a poly-silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center of the semiconductor layer 152.

The gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on an entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 166 and 164 exposing both sides of the semiconductor layer 152. The first and second contact holes 166 and 164 are positioned at both sides of the gate electrode 160 to be spaced apart from the gate electrode 160.

The first and second contact holes 166 and 164 extend into the gate insulating layer 154. Alternatively, when the gate insulating layer 154 is patterned to have the same shape as the gate electrode 160, there may be no first and second contact holes 166 and 164 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 166 and 164. The source electrode 170 is connected to the power line PL (of FIG. 1).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may include amorphous silicon.

On the other hand, the switching TFT Ts (of FIG. 1) may have substantially same structure as the TFT Td.

A passivation layer 174, which includes a drain contact hole 176 exposing a part, for example, the drain electrode 172 of the TFT Td, is formed to cover the TFT Td.

A first electrode 110, which is connected to the drain electrode 172 of the TFT Td through the drain contact hole 176, is separately formed on the passivation layer 174 in each pixel region. The first electrode 110 may be an anode and may be formed of a conductive material having a relatively high work function. For example, the first electrode 110 may be formed of a transparent conductive material such as indium-tin-oxide (ITO) or indium-zinc-oxide (IZO).

When the QD display device 100 of the present disclosure is a top-emission type, a reflection electrode or a reflection layer may be formed under the first electrode 110. For example, the reflection electrode or the reflection layer may be formed of aluminum-palladium-copper (APC) alloy.

A bank layer 115, which covers edges of the first electrode 110, is formed on the passivation layer 174. The bank layer 115 exposes a center of the first electrode 110 in the pixel region.

An emitting layer 112 is formed on the first electrode 110. The emitting layer 112 includes a QD emitting material layer (QD EML) 130, a hole auxiliary layer 120 under the QD EML 130 and an electron auxiliary layer 140 over the QD EML 130.

A second electrode 114 is formed over the substrate 150 including the emitting layer 112. The second electrode 114 is positioned at an entire surface of the display area. The second electrode 114 may be a cathode and may be formed of a conductive material having a relatively low work function. For example, the second electrode 114 may be formed of aluminum (Al), magnesium (Mg) or Al—Mg alloy.

The hole auxiliary layer 120 is positioned between the first electrode 110 and the QD EML 130, and the electron auxiliary layer 140 is positioned between the QD EML 130 and the second electrode 114.

The first electrode 110, the emitting layer 112 and the second electrode 114 constitute the QD light emitting diode D.

As will be described below, a ligand at one surface of the QD in the QD EML 130 is removed such that the charge balance in the QD light emitting diode D is improved. Accordingly, the emitting efficiency of the QD light emitting diode D and the QD light emitting display device 100 is improved.

Figure 3:
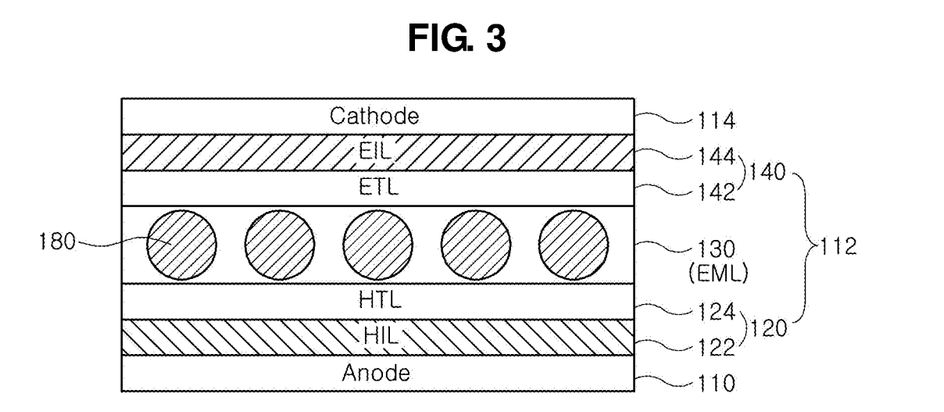
FIG. 3 is a schematic cross-sectional view of a QD light emitting diode according to a first aspect of the present disclosure.

FIG. 3 is a schematic cross-sectional view of a QD light emitting diode according to a first aspect of the present disclosure.

As shown in FIG. 3, the QD light emitting diode D of the present disclosure includes a first electrode 110, a second electrode 114 facing the first electrode 110 and an emitting layer 112 between the first and second electrodes 110 and 114. The emitting layer 112 includes a QD EML 130, a hole auxiliary layer 120 between the first electrode 110 and the QD EML 130 and an electron auxiliary layer 140 between the QD EML 130 and the second electrode 114.

The first electrode 110 may be an anode, and the second electrode 114 may be a cathode.

The hole auxiliary layer 120 may include a hole transporting layer (HTL) 124 between the first electrode 110 and the QD EML 130 and a hole injection layer (HIL) 122 between the first electrode 110 and the HTL 124. One of the HIL 122 and the HTL 124 may be omitted.

The electron auxiliary layer 140 may include an electron transporting layer (ETL) 142 between the QD EML 130 and the second electrode 114 and an electron injection layer (EIL) 144 between the ETL 142 and the second electrode 114. One of the ETL 142 and the EIL 144 may be omitted.

The QD EML 130 includes a plurality of QDs 180. Each QD 180 is formed of a semiconductor material.

Figure 4:
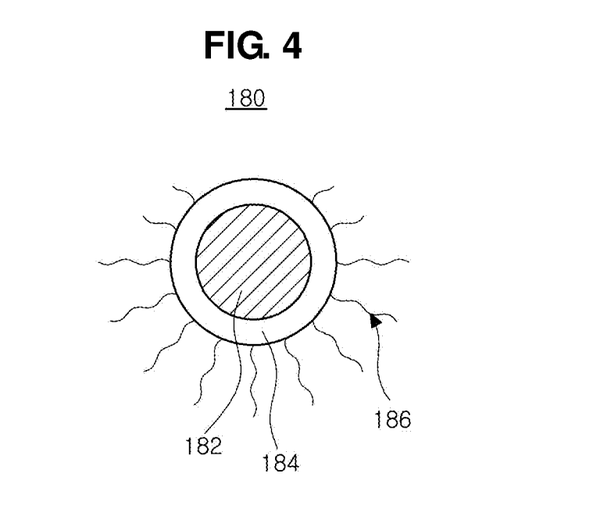
FIG. 4 is a schematic view illustrating a QD of the present disclosure.

Referring to FIG. 4, which is a schematic view illustrating a QD of the present disclosure, the QD 180 includes a core 182, which is positioned in a center of the QD 180 and emitting light, a shell 184 surrounding (or enclosing) the core 182 and a ligand 186 connected to (or combined with) a surface of the shell 184.

The core 182 and the shell 184 have a difference in an energy bandgap. Each of the core 182 and the shell 184 may include a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The ligand 186 may be C1 to C30 alkyl group. The QD 180 may be dispersed in a solvent by the ligand 186. The ligand 186 is connected to the shell 184 to expose a surface of the shell 184 in a first side (one side) and to cover a surface of the shell 184 in a second side (the other side). Namely, the ligand 186 at the surface of the shell 184 in the first side is removed such that the surface of the shell 184 in the first side is exposed.

Accordingly, the hole auxiliary layer 120 contacts the ligand 186 of the QD 180, and the electron auxiliary layer 140 contacts the shell 184 of the QD 180. In addition, the ligand 186 of a first QD 180 (one QD) contacts the ligand 186 of a second QD 180 (the other QD) adjacent to the first QD 180.

As mentioned above, the ligand 186 is formed on the surface of the shell 184 to improve the dispersion of the QD 180 in the solvent. However, the ligand 186 acts as a barrier against charge injection. Namely, the hole injection and the electron injection is blocked or restricted by the ligand 186 on the shell 184 of the QD 180.

However, in the QD light emitting diode of the present disclosure, since the ligand 186 at the surface of the shell 184 in the first side is removed, the charge injection rate is increased such that the emitting efficiency of the QD light emitting diode D and the QD light emitting display device 100 is improved.

In addition, since the ligand 186 at the surface of the shell 184 in only the first side is removed, the injection rate of the electron is increased such that the charge balance in the QD light emitting diode D and the QD light emitting display device 100 is improved. As a result, the emitting efficiency of the QD light emitting diode D and the QD light emitting display device 100 is further improved.

In the related art QD light emitting diode, where the electron injection rate is slower than the hole injection rate, the charge balance is destroyed (degraded).

However, in the QD light emitting diode D of the present disclosure, the ligand at an upper side surface of the shell 184 is removed such that the electron auxiliary layer 140 contacts the shell 184 of the QD 180. As a result, the electron injection rate is increased, and the charge balance is improved. In other words, the hole auxiliary layer 120 contacts the ligand 186 of the QD 180 such that the hole injection rate is not changed, but the electron auxiliary layer 140 contacts the shell 184 of the QD 180 such that the electron injection rate is increased. As a result, the shell 184 of the QD 180 has a first distance from the hole auxiliary layer 120 and a second distance from the electron auxiliary layer 140, and the first distance is greater than the second distance because there is no ligand between the shell 184 and the electron auxiliary layer 140.

In addition, as will be described below, since the ligand at the upper side surface of the QD 180 is removed by a dry-etching process after the QD EML 130 is formed using the QD 180, where the ligand 186 is formed on an entire surface of the shell 184, the dispersion property of the QD 180 into the solvent is not degraded.

Moreover, since the ligand 186 is removed by the dry-etching process not a wet-etching process, the damages on the core 182 and/or the shell 184 of the QD 180 and/or a lower layer, i.e., the hole auxiliary layer 120, by a liquid-phase etchant, which is used in the wet-etching process, are prevented.

Figure 5A:
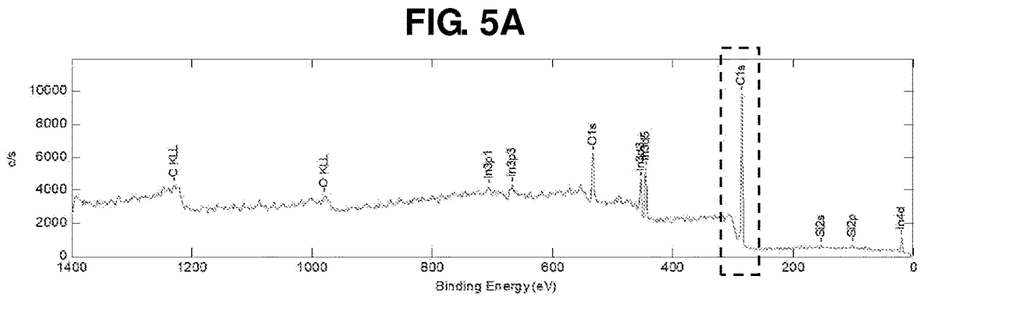
FIGS. 5A and 5B are graphs showing a X-ray photoelectron spectroscopy (XPS) of a QD emitting layer in a QD light emitting diode of the present disclosure.
Figure 5B:
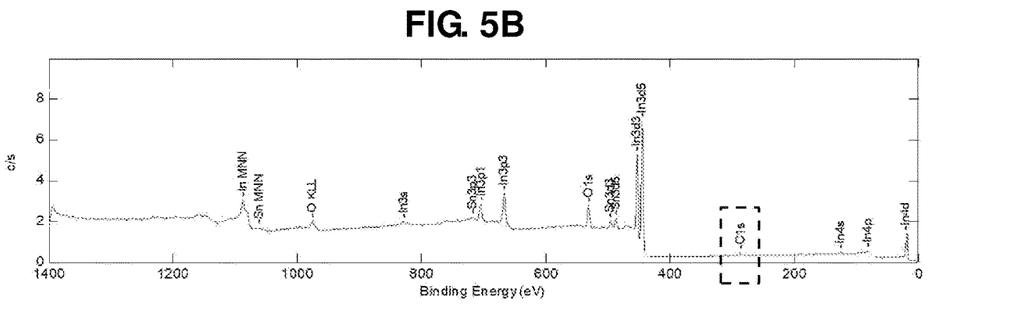

FIGS. 5A and 5B are graphs showing an X-ray photoelectron spectroscopy (XPS) of a QD emitting layer in a QD light emitting diode of the present disclosure. FIG. 5A is the XPS graph of the QD before the dry-etching process, and FIG. 5B is the XPS graph of the QD after the dry-etching process. The graphs in FIGS. 5A and 5B show the XPS data in the depth of about 5 nm.

As shown in FIG. 5A, the ligand is formed on an entire surface of the QD before the dry-etching process such that alkyl group as the ligand is detected.

However, as shown in FIG. 5B, the ligand at the upper side surface of the QD is removed after the dry-etching process such that alkyl group is not detected.

FIGS. 6A to 6E are schematic cross-sectional view illustrating a fabricating process of a QD light emitting display device of the present disclosure.

Figure 6A:
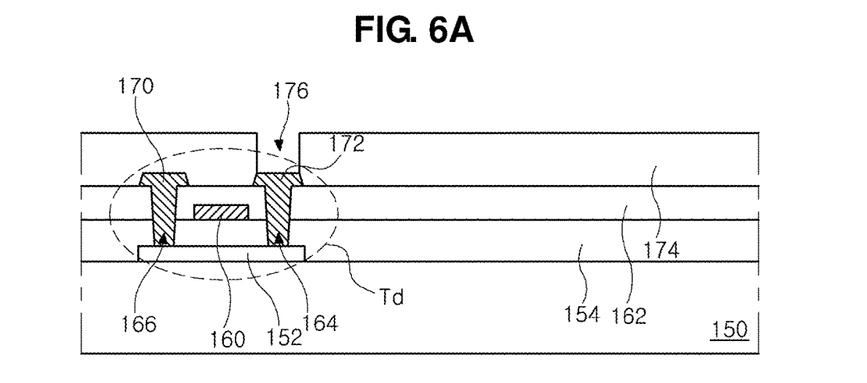
FIGS. 6A to 6E are schematic cross-sectional view illustrating a fabricating process of a QD light emitting display device of the present disclosure.

As shown in FIG. 6A, the driving TFT Td is formed on the substrate 150, and the passivation layer 174, which includes the drain contact hole 176 exposing the drain electrode 172 of the driving TFT Td, is formed to cover the driving TFT Td.

More specifically, a semiconductor material is deposited on the substrate 150 and patterned by a mask process to form the semiconductor layer 152.

Next, the gate insulating layer 154 of an insulating material is formed on an entire surface of the substrate 150 and over the semiconductor layer 152.

Next, a low resistance metallic material, such as Cu or Al, is deposited on the gate insulating layer 154 and patterned by a mask process to form the gate electrode 160 on the gate insulating layer 154. The gate electrode 160 may correspond to a center of the semiconductor layer 152. Although not shown, the gate line extending along a first direction may be formed on the gate insulating layer 154.

Next, an insulating material layer is formed on the gate electrode 160 and patterned by a masking process to form the interlayer insulating layer 162 having the first and second contact holes 166 and 164. Both sides of the semiconductor layer 152 are exposed by the first and second contact holes 166 and 164, respectively.

Next, a low resistance metallic material, such as Cu or Al, is deposited on the interlayer insulating layer 162 and patterned by a masking process to form the source electrode 170 and the drain electrode 172 on the interlayer insulating layer 162. The source electrode 170 and the drain electrode 172 are spaced apart from each other with respect to the gate electrode 160 and respectively contact both sides of the semiconductor layer 152 through the first and second contact holes 166 and 164.

Although not shown, the data line, which extends along a second direction, and the power line, which is parallel to and spaced apart from the data line, may be formed on the interlayer insulating layer 162.

The semiconductor layer 152, the gate electrode 160, the source electrode 170 and the drain electrode 172 constitute the driving TFT Td.

Next, an insulating material layer is formed on the driving TFT Td and patterned by a masking process to form the passivation layer 174 having the drain contact hole 176 exposing the driving TFT Td.

Figure 6B:
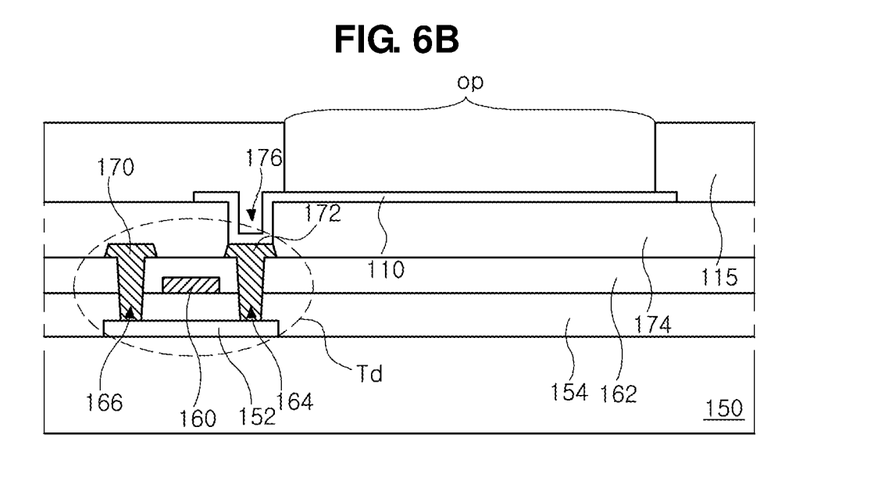

Next, as shown in FIG. 6B, a transparent conductive material is deposited on the passivation layer 174 and patterned by a masking process to form the first electrode 110 in each pixel region. The first electrode 110 is connected to the drain electrode 172 of the driving TFT Td through the drain contact hole 176.

Next, an insulating material layer is formed and patterned by a masking process to form the bank layer 115 having an opening op. The bank layer 115 covers an edge of the first electrode 110, and the opening op exposes a center of the first electrode 110.

Figure 6C:
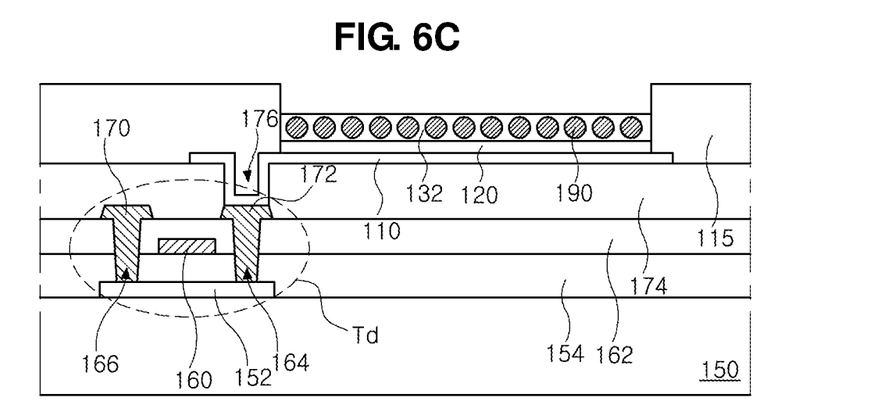

Next, as shown in FIG. 6C, a hole transporting material and/or a hole injection material is deposited or coated in the opening op (of FIG. 6B) to form the hole auxiliary layer (a first charge auxiliary layer) 120. For example, the hole auxiliary layer 120 may include the HIL 122 (of FIG. 3) and the HTL 124 (of FIG. 3) sequentially stacked on the first electrode 110.

Figure 7:
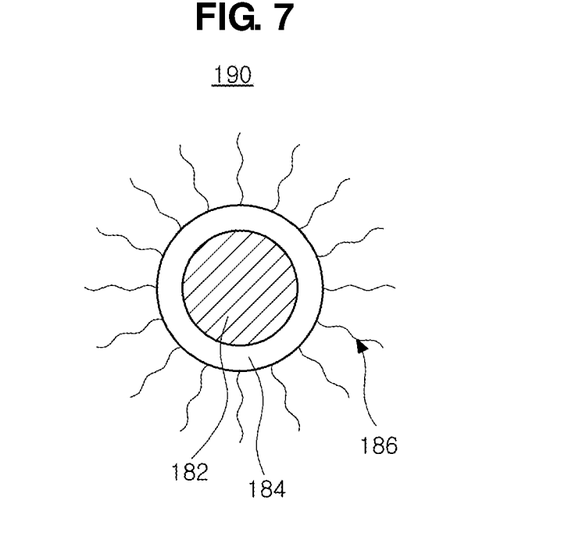
FIG. 7 is a schematic view illustrating a pristine QD.

Next, a QD solution, where the ligand is formed on an entire surface of the shell of the QD 190, is coated and dried to form a QD layer 132 on the hole auxiliary layer 120. Namely, referring to FIG. 7, which is a schematic view illustrating a pristine QD, the QD 190 in the step of FIG. 6C includes a core 182, a shell 184 surrounding the core 182 and a ligand 186 formed on (or connected to) an entire surface of the shell 184.

Figure 6D:
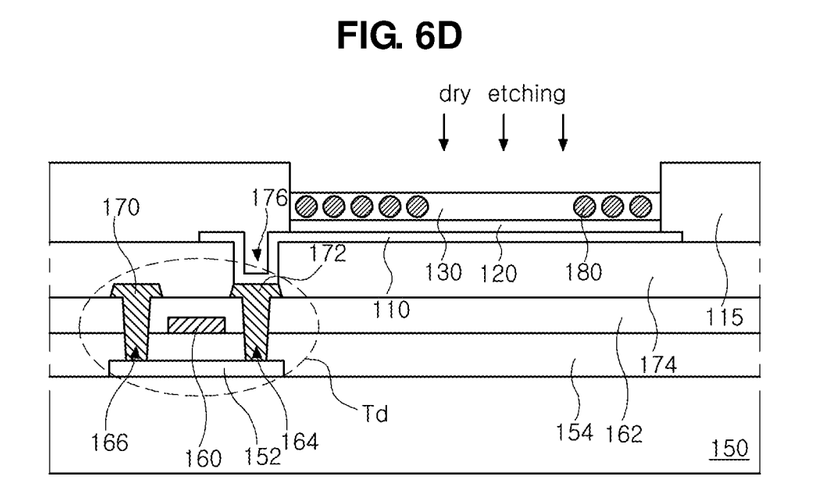

Next, as shown in FIG. 6D, a dry-etching process is performed onto the QD 190 (of FIG. 6C) to remove the ligand 186 (of FIG. 7) on one side surface, i.e., an upper side surface, of the pristine QD 190 (of FIG. 6C). As result, the QD EML 130 including the QD 180, where the ligand on one side surface is removed and the ligand on the other side surface exists, is formed. Accordingly, an upper surface of the hole auxiliary layer 120 contacts the ligand 186 of the QD 180.

The dry-etching process may be a sputtering process using an inert gas, e.g., Ar. For example, the dry-etching process may be performed under a pressure of about $1*10^{-7} \sim 1*10^{-5}$ Torr and for 0.2 to 1 minute.

As mentioned above, since the solution, where the pristine QD 190 including the ligand 186 at an entire surface is dispersed in the solvent, is coated to form the QD layer 132, the dispersion property of the QD is not degraded.

In addition, since the ligand 186 is removed by the dry-etching process not a wet-etching process, the damages on the core 182 and/or the shell 184 of the QD 180 and/or a lower layer, i.e., the hole auxiliary layer 120 by the wet-etching process are prevented.

Figure 6E:
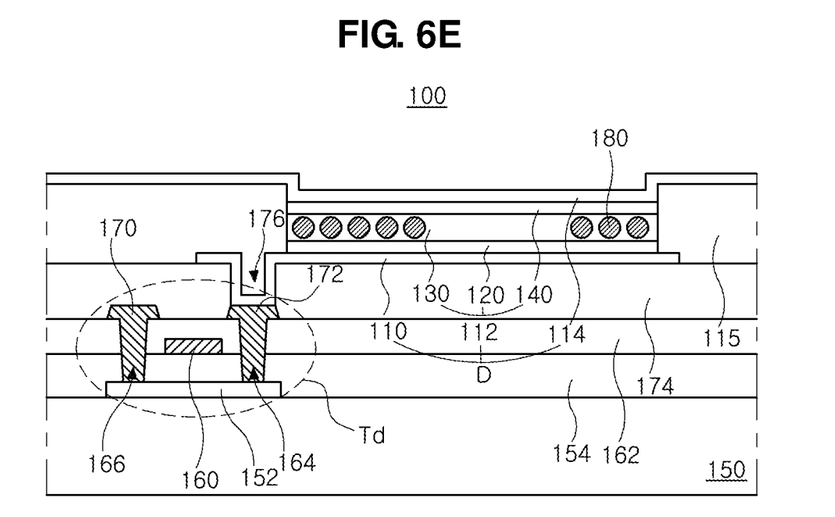

Next, as shown in FIG. 6E, an electron transporting material and/or an electron injection material is deposited or coated to form the electron auxiliary layer (a second auxiliary layer) 140 on the QD EML 130. A lower surface of the electron auxiliary layer 140 contacts the shell 184 of the QD 180. For example, the electron auxiliary layer 140 may include the ETL 142 (of FIG. 3) and the EIL 144 (of FIG. 3) sequentially stacked on the QD EML 130.

Next, a metallic material is deposited on the electron auxiliary layer 140 to form the second electrode 114.

As mentioned above, since the ligand at an upper side surface of the QD 180 is removed, the electron auxiliary layer 140 contacts the shell 184 of the QD 180 such that electron injection rate is increased. Accordingly, in comparison to the related art QD light emitting diode, where the electron injection rate is slower than the hole injection rate, the charge balance and the emitting efficiency of the QD light emitting diode D and the QD light emitting display device 100 of the present disclosure are improved.

Figure 8:
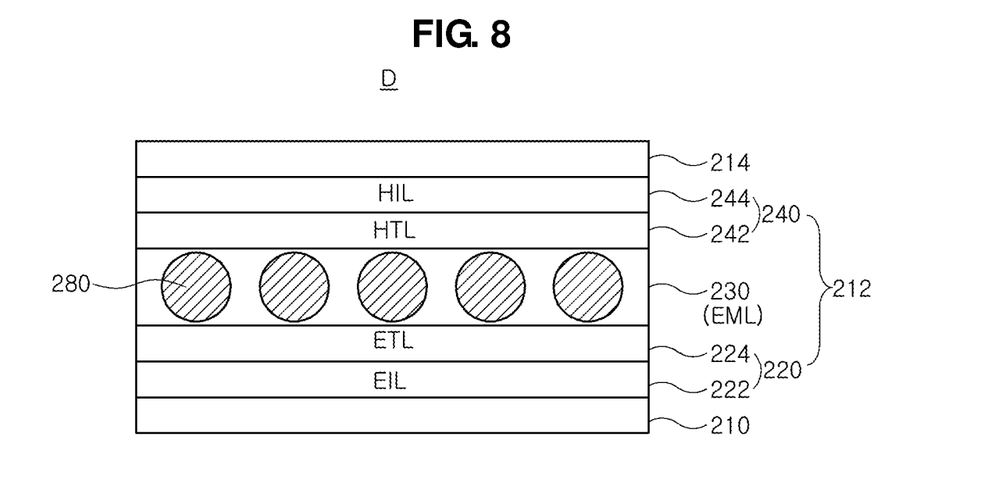
FIG. 8 is a schematic cross-sectional view of a QD light emitting diode according to a second aspect of the present disclosure.

FIG. 8 is a schematic cross-sectional view of a QD light emitting diode according to a second aspect of the present disclosure.

As shown in FIG. 8, the QD light emitting diode D of the present disclosure includes a first electrode 210, a second electrode 214 facing the first electrode 210 and an emitting layer 212 between the first and second electrodes 210 and 214. The emitting layer 212 includes a QD EML 230, an electron auxiliary layer 220 between the first electrode 210 and the QD EML 230 and a hole auxiliary layer 240 between the QD EML 230 and the second electrode 214.

The first electrode 210 may be formed of a transparent conductive material such as indium-tin-oxide (ITO) or indium-zinc-oxide (IZO) and serve as a cathode. The second electrode 214 may be formed of aluminum (Al), magnesium (Mg) or Al—Mg alloy and serve as an anode. The first electrode 210 is connected to the driving TFT Td (of FIG. 2).

The electron auxiliary layer 220 may include an ETL 224 between the first electrode 210 and the QD EML 230 and an EIL 222 between the ETL 224 and the first electrode 210. One of the ETL 224 and the EIL 222 may be omitted.

The hole auxiliary layer 240 may include an HTL 242 between the QD EML 230 and the second electrode 214 and an HIL 244 between the HTL 242 and the second electrode 214. One of the HIL 244 and the HTL 242 may be omitted.

The QD EML 230 includes a plurality of QDs 280. Each QD 280 is formed of a semiconductor material.

Referring again to FIG. 4, the QD 280 includes a core 182, which is positioned in a center of the QD 280 and emitting light, a shell 184 surrounding the core 182 and a ligand 186 connected to a surface of the shell 184.

The core 182 and the shell 184 have a difference in an energy bandgap. Each of the core 182 and the shell 184 may include a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The ligand 186 may be C1 to C30 alkyl group. The QD 280 may be dispersed in a solvent by the ligand 186. The ligand 186 is connected to the shell 184 to expose a surface of the shell 184 in a first side (one side) and to cover a surface of the shell 184 in a second side (the other side). Namely, the ligand 186 at the surface of the shell 184 in the first side is removed such that the surface of the shell 184 in the first side is exposed.

Accordingly, the electron auxiliary layer 220 contacts the ligand 186 of the QD 280, and the hole auxiliary layer 240 contacts the shell 184 of the QD 280. In addition, the ligand 186 of a first QD 280 (one QD) contacts the ligand 186 of a second QD 280 (the other QD) adjacent to the first QD 280.

As mentioned above, the ligand 186 is formed on the surface of the shell 184 to improve the dispersion of the QD 280 in the solvent. However, the ligand 186 acts as a barrier against charge injection. Namely, the hole injection and the electron injection is blocked or restricted by the ligand 186 on the shell 184 of the QD 280.

However, in the QD light emitting diode of the present disclosure, since the ligand 186 at the surface of the shell 184 in the first side is removed, the charge injection rate is increased such that the emitting efficiency of the QD light emitting diode D and the QD light emitting display device 100 (of FIG. 2) is improved.

In addition, since the ligand 186 at the surface of the shell 184 in only the first side is removed, the injection rate of the hole is increased such that the charge balance in the QD light emitting diode D and the QD light emitting display device 100 is improved. As a result, the emitting efficiency of the QD light emitting diode D and the QD light emitting display device 100 is further improved.

In the related art QD light emitting diode, where the hole injection rate is slower than the electron injection rate, the charge balance is destroyed (degraded).

However, in the QD light emitting diode D of the present disclosure, the ligand at an upper side surface of the shell 184 is removed such that the hole auxiliary layer 240 contacts the shell 184 of the QD 280. As a result, the hole injection rate is increased, and the charge balance is improved. In other words, the electron auxiliary layer 220 contacts the ligand 186 of the QD 280 such that the electron injection rate is not changed, but the hole auxiliary layer 240 contacts the shell 184 of the QD 280 such that the hole injection rate is increased. As a result, the shell 184 of the QD 280 has a first distance from the electron auxiliary layer 220 and a second distance from the hole auxiliary layer 240, and the first distance is greater than the second distance because there is no ligand between the shell 184 and the hole auxiliary layer 240.

In addition, since the ligand at the upper side surface of the QD 280 is removed by a dry-etching process after the QD EML 230 is formed using the QD 280, where the ligand 186 is formed on an entire surface of the shell 184, the dispersion property of the QD 280 into the solvent is not degraded.

Moreover, since the ligand 186 is removed by the dry-etching process not a wet-etching process, the damages on the core 182 and/or the shell 184 of the QD 280 and/or a lower layer, i.e., the electron auxiliary layer 220, by a liquid-phase etchant, which is used in the wet-etching process, are prevented.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A quantum-dot (QD) light emitting diode, comprising:
   first and second electrodes facing each other;
   a QD emitting material layer between the first and second electrodes and including a QD;
   a first charge auxiliary layer between the first electrode and the QD emitting material layer; and
   a second charge auxiliary layer between the QD emitting material layer and the second electrode,
   wherein the QD includes a core, a shell surrounding the core and a ligand contacting a portion of the shell, and
   wherein the first charge auxiliary layer contacts the ligand, and the second charge auxiliary layer contacts the shell.

2. The QD light emitting diode according to claim 1, wherein the first charge auxiliary layer is one of a hole auxiliary layer and an electron auxiliary layer, and the second charge auxiliary layer is the other one of the hole auxiliary layer and the electron auxiliary layer.

3. The QD light emitting diode according to claim 2, wherein the hole auxiliary layer includes at least one of a hole injection layer and a hole transporting layer, and the electron auxiliary layer includes at least one of an electron injection layer and an electron transporting layer.

4. The QD light emitting diode according to claim 1, wherein the QD includes first and second QD adjacent to each other, and the ligand of the first QD contacts the ligand of the second QD.

5. The QD light emitting diode according to claim 1, wherein the ligand is C1 to C11 alkyl group.

6. The QD light emitting diode according to claim 1, wherein the core and the shell have an energy gap different from each other.

7. The QD light emitting diode according to claim 1, wherein each of the core and the shell includes a nano-size semiconductor material of II-VI group element or III-V group element.

8. A method of fabricating a quantum-dot (QD) light emitting diode, comprising:
   forming a first or second electrode;
   forming a light emitting layer on the first or second electrode corresponding to a center of the first or second electrode; and
   forming a second or first electrode facing the first or second electrode on the light emitting layer,
   wherein the forming the light emitting layer further comprises:
   forming a hole auxiliary layer corresponding to the center of the first electrode or forming an electron auxiliary layer corresponding to the center of the second electrode;
   coating a QD solution and drying the coated QD solution to form a layer having a plurality of QDs on the hole auxiliary layer or electron auxiliary layer, each QD including a core, a shell surrounding the core and a ligand formed on an entire surface of the shell;
   removing the ligand at a first side the shell so as to form a QD light emitting material layer (EML); and
   forming an electron or hole auxiliary layer on the QD EML,
   wherein one of the electron auxiliary layer and the hole auxiliary layer contacts the shell, and the other of the electron auxiliary layer and the hole auxiliary layer contacts the ligand at a second side of the shell.

9. The method according to claim 8, wherein the first electrode is at the second side of the shell, the electron auxiliary layer contacts the shell, and the hole auxiliary layer contacts the ligand at the second side of the shell.

10. The method according to claim 8, wherein the first electrode is at the first side of the shell, the hole auxiliary layer contacts the shell, and the electron auxiliary layer contacts the ligand at the second side of the shell.

11. The method according to claim 8, wherein the ligand is C1 to C11 alkyl group.

12. The method according to claim 8, wherein each of the core and the shell includes a nano-size semiconductor material of II-VI group element or III-V group element.

13. The method according to claim 8, wherein the step of removing the ligand at the first side the shell includes performing a dry-etching process on the QDs to remove the ligand at the first side of the shell.

14. A QD light emitting display device, comprising:
   a substrate;
   a QD light emitting diode disposed over the substrate, the QD light emitting diode comprising:
      first and second electrodes facing each other;
      a QD emitting material layer between the first and second electrodes and including a QD;
      a first charge auxiliary layer between the first electrode and the QD emitting material layer; and
      a second charge auxiliary layer between the QD emitting material layer and the second electrode; and
   a thin film transistor between the substrate and the QD light emitting diode and connected to the QD light emitting diode,
   wherein the QD includes a core, a shell surrounding the core and a ligand contacting a portion of the shell, and
   wherein a distance between the shell and the first charge auxiliary layer is greater than a distance between the shell and the second charge auxiliary layer.

15. The QD light emitting display device according to claim 14, further comprising a bank layer covering edges of the first electrode and disposed over the thin film transistor, wherein the bank layer exposes a center of the first electrode.

16. The QD light emitting diode according to claim 14, wherein the first charge auxiliary layer is one of a hole auxiliary layer and an electron auxiliary layer, and the second charge auxiliary layer is the other one of the hole auxiliary layer and the electron auxiliary layer.

17. The QD light emitting diode according to claim 16, wherein the hole auxiliary layer includes at least one of a hole injection layer and a hole transporting layer, and the electron auxiliary layer includes at least one of an electron injection layer and an electron transporting layer.

18. The QD light emitting diode according to claim 14, wherein the QD includes first and second QD adjacent to each other, and the ligand of the first QD contacts the ligand of the second QD.

19. The QD light emitting diode according to claim 14, wherein the ligand is C1 to C11 alkyl group.

20. The QD light emitting diode according to claim 14, wherein each of the core and the shell includes a nano-size semiconductor material of II-VI group element or III-V group element.

21. The QD light emitting diode according to claim 14, wherein the first charge auxiliary layer contacts the ligand, and the second charge auxiliary layer contacts the shell.

* * * * *